United States Patent
Chow et al.

(10) Patent No.: US 6,396,368 B1
(45) Date of Patent: May 28, 2002

(54) CMOS-COMPATIBLE MEM SWITCHES AND METHOD OF MAKING

(75) Inventors: Lap-Wai Chow, South Pasadena; Tsung-Yuan Hsu, Westlake Village, both of CA (US); Daniel J. Hyman, Cleveland, OH (US); Robert Y. Loo, Agoura Hills, CA (US); Paul Ouyang, San Jose, CA (US); James H. Schaffner, Chatsworth, CA (US); Adele Schmitz, Newbury Park, CA (US); Robert N. Schwartz, Costa Mesa, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 09/438,085

(22) Filed: Nov. 10, 1999

(51) Int. Cl.[7] .............................. H01P 1/10; H01H 57/00; H03K 17/975
(52) U.S. Cl. ..................... 333/262; 200/181; 200/600
(58) Field of Search .......................... 333/262; 200/181, 200/600, 262–270, 275

(56) References Cited

U.S. PATENT DOCUMENTS

| | | |
|---|---|---|
| 5,121,089 A | 6/1992 | Larson |
| 5,541,614 A | 7/1996 | Lam et al. |
| 5,638,946 A | 6/1997 | Zavracky |
| 6,054,659 A | 4/2000 | Lee et al. |
| 6,057,520 A * | 5/2000 | Goodwin-Johansson .... 200/181 |

FOREIGN PATENT DOCUMENTS

WO  00/44012  7/2000

OTHER PUBLICATIONS

Larson, L.E., et al., "Microactuators for GaAs–based Microwave Integrated Circuits," *IEEE* (1991), pp. 743–746.

* cited by examiner

*Primary Examiner*—Robert Pascal
*Assistant Examiner*—Kimberly E Glenn
(74) *Attorney, Agent, or Firm*—Ladas & Parry

(57) ABSTRACT

A microelectromechanical (MEM) switch is fabricated inexpensively by using processing steps which are standard for fabricating multiple metal layer integrated circuits, such as CMOS. The exact steps may be adjusted to be compatible with the process of a particular foundry, resulting in a device which is both low cost and readily integrable with other circuits. The processing steps include making contacts for the MEM switch from metal plugs which are ordinarily used as vias to connect metal layers which are separated by a dielectric layer. Such contact vias are formed on either side of a sacrificial metallization area, and then the interconnect metallization is removed from between the contact vias, leaving them separated. Dielectric surrounding the contacts is etched back so that they protrude toward each other. Thus, when the contacts are moved toward each other by actuating the MEM switch, they connect firmly without obstruction. Tungsten is typically used to form vias in CMOS processes, and it makes an excellent contact material, but other via metals may also be employed as contacts. Interconnect metallization may be employed for other structural and interconnect needs of the MEM switch, and is preferably standard for the foundry and process used. Various metals and dielectric materials may be used to create the switches, but in a preferred embodiment the interconnect metal layers are aluminum and the dielectric material is $SiO_2$, materials which are fully compatible with standard four-layer CMOS fabrication processes.

19 Claims, 2 Drawing Sheets

US 6,396,368 B1

CMOS-COMPATIBLE MEM SWITCHES AND METHOD OF MAKING

FIELD OF THE INVENTION

The present invention pertains to microfabricated electro-mechanical (MEM) switches which are fabricated on a substrate, and particularly to those which are fabricated for integration into circuits utilizing typical CMOS processing steps.

BACKGROUND

MEM switches in various forms are well-known in the art. U.S. Pat. No. 5,121,089 to Larson, granted in 1992, describes an example of a MEM switch in which the armature rotates symmetrically about a post. That inventor also suggested cantilevered beam MEM switches, in "Microactuators for GaAs—based microwave integrated circuits" by L. E. Larson et al., Journal of the Optical Society of America B, 10, 404–407 (1993).

MEM switches are very useful for controlling very high frequency lines, such as antenna feed lines and switches operating above 1 GHz, due to their relatively low insertion loss and high isolation value at these frequencies. Therefore, they are particularly useful for controlling high frequency antennas, as is taught by U.S. Pat. No. 5,541,614 to Lam et al. (1996). Such MEM switches have been made typically using gold to provide metal for the contacts.

It is desirable to fabricate such antennas in an array, and thus the MEM switch controllers need to be in an array also. In order to reduce costs and simplify producing arrays of MEM switches using known techniques, it is desirable to make MEM switch construction compatible with CMOS processes. Gold is not available in typical CMOS fabrication processes. Aluminum has been used for MEM switch contacts with CMOS processing, but aluminum contacts suffer from a tendency to oxidize and to adsorb surface contaminants. Polysilicon has also been used, but is a material of very high resistivity and thus does not readily provide good contact connections.

Thus, there exists a need for MEM switches which are compatible with CMOS processes, and which have an improved contact system.

SUMMARY OF THE INVENTION

The present invention solves the problem of building MEM switches which are entirely compatible with standard integrated circuit processes, such as CMOS, and which yet have low resistance contacts with good high-frequency performance.

The present invention provides a method to fabricate high-performance MEM switches using standard metallization layer interconnect vias. In the preferred embodiment, which utilizes CMOS fabrication steps, aluminum metallization is used for RF transmission lines and mechanical structural elements, and tungsten plugs are used as contacts for the MEM switches. Tungsten contacts are not only less susceptible to oxidation and to adsorption of contaminants than is aluminum, but they also have higher annealing and melting temperatures, and are harder. Thus, tungsten contacts provide greater contact lifetime and higher current-carrying capacity than aluminum, and much lower resistance than polysilicon.

Tungsten is currently preferred in most multiple metallization layer CMOS processing, but the present invention is directed not only to the use of tungsten, but to the use of CMOS via material, whatever it might be, to form MEM switch contacts.

DESCRIPTION OF THE PREFERRED EMBODIMENTS

Figure 5:
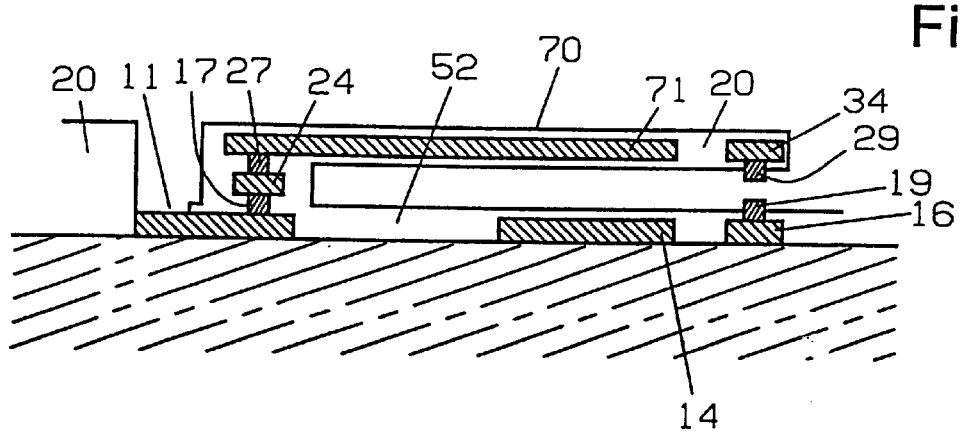
FIG. 5 is the MEM switch cross-section structure after a pad opening etch.
Figure 6:
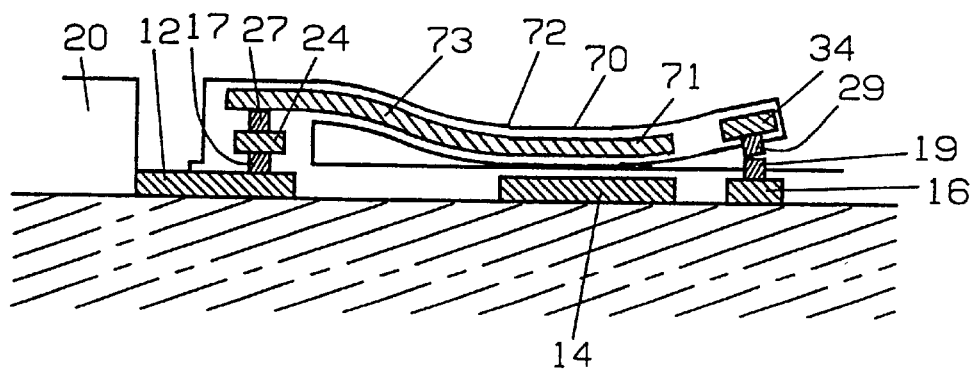
FIG. 6 shows the MEM switch cross-section structure when it is actuated.
Figure 7:
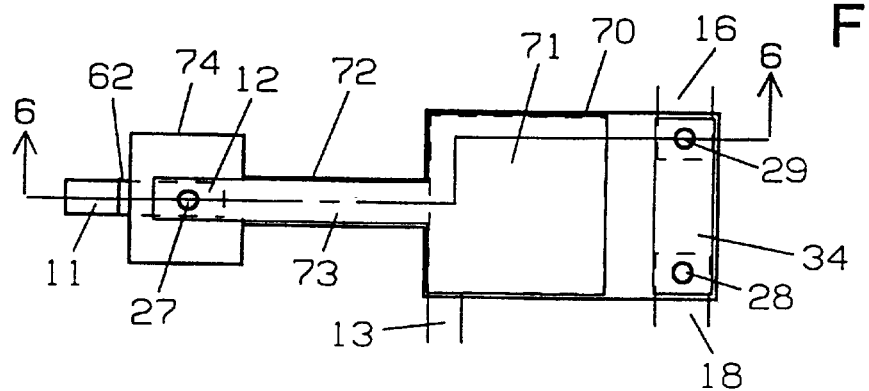
FIG. 7 shows a top view of the MEM switch indicating the cross-section.

For an overview of a Microfabricated Electro-Mechanical (MEM) switch as described herein, we turn to FIGS. 5–7, which show the MEM switch at the end of the processing described below. FIG. 7 shows a top view of the MEM switch, and FIGS. 5 and 6 show a cross-section of the MEM switch taken along cross-section line 6—6 shown in FIG. 7. In FIG. 5 the MEM switch is relaxed, and in FIG. 6 it is actuated (closed). Armature 70 includes upper plate 71 and interconnect strip 34 (with contact plugs 29 and 2), as well as cantilever beam 72, which includes upper plate connecting strip 73. Cantilever beam 72 is anchored by anchor 74. In operation, armature 70 is drawn toward substrate 10 by an electrostatic field between upper plate 71 and lower plate 14. The electrostatic field is produced by connecting upper plate 71 to a first potential via interconnect plug 27 and source connection trace 12, while lower plate 14 is connected to a different second potential via common connection trace 13. When thus actuated, upper contacts 29 and 28 become connected to lower contacts 19 and 18 such that signal connection 16 is connected to signal connection 18 via armature interconnect strip 34.

Figure 1:
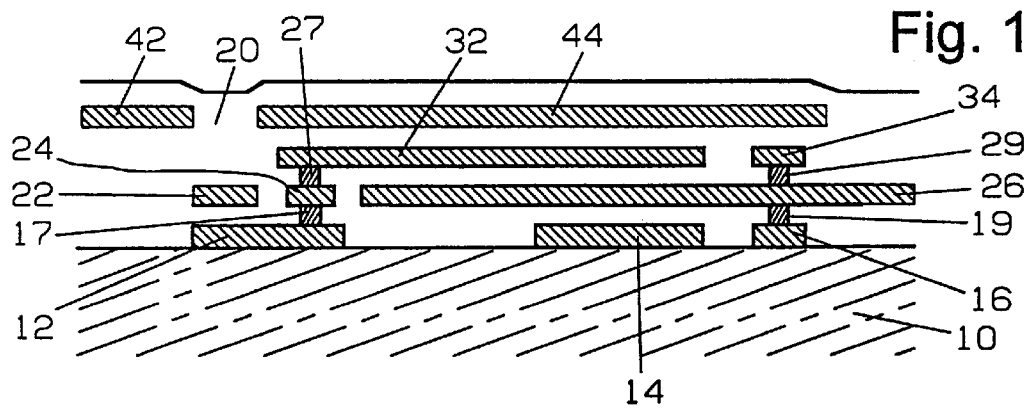
FIG. 1 is cross-section of 4-layer CMOS metallization for fabricating a MEM switch.

FIG. 1 shows a cross-sectional view of a structure for a MEM switch, including four layers of metallization: Metal 1, 12–14–16; Metal 2, 22–24–26; Metal 3, 32–34; and Metal 4, 42–44. The metallization is typically aluminum, and is surrounded by dielectric 20, typically $SiO_2$, such that the structure is readily produced by four-layer CMOS processing which is well known in the art. The Metal 1 and Metal 2 layers are interconnected by tungsten plug 17 (between metallization segments 12 and 24) and 19 (between segments 16 and 26). Similarly, tungsten plugs 27 and 29 interconnect the Metal 2 and Metal 3 layers at segments 24 and 32, and segments 26 and 34, respectively. Metallization segments 42, 44 and 22 provide an etch-stop layer for a subsequent Reactive Ion Etch (RIE) process.

The layer thicknesses are primarily determined by the capabilities of the foundry which will fabricate the devices. For example, typical foundry thicknesses are approximately 1 micron for metallization, and approximately 1 to 1.5 microns for dielectric layers.

The entire four-layer structure is shown fabricated upon a foundation shown as layer 10, which is typically Si and will be referred to as a substrate. However, layer 10 could as well be any material suitable for application of the four metallization layers. For example, this four-layer metallization processing may be performed upon other materials than Si. Layer 10 may have been previously fabricated with separate device structures of any sort, including metallization or doping layer structures. It is only necessary that layer 10 provide an adequately flat region, compatible with subsequent metallization and oxide layer depositions, upon which to facilitate accurate fabrication of the four layer metallization described herein.

Figure 2:
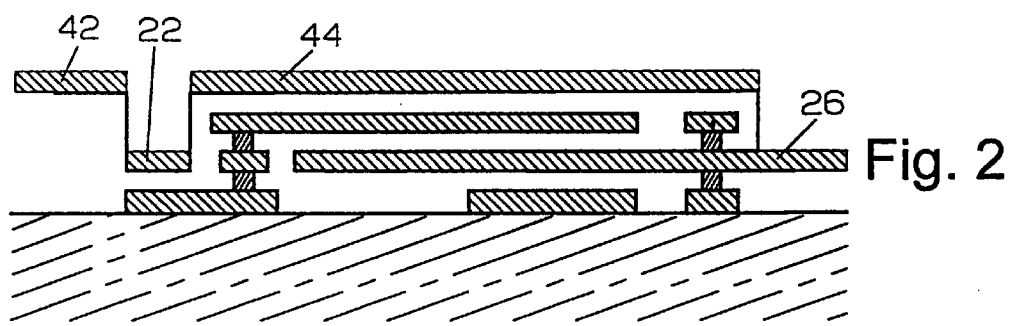
FIG. 2 is the structure of FIG. 1 after Reactive Ion Etch (RIE).

FIG. 2 shows the structure of FIG. 1 after an etch step, preferably $CF_4/O_2$ RIE, has removed the dielectric down to metal etch-stop features 42, 22, 44 and 26. RIE is preferred due to its high aspect ratio, which limits lateral etching, but any other reasonably high aspect ratio etch may be used as well. The etch step removes all dielectric oxides not covered by metal layer four, including overglass, intermetal dielectric oxide and field oxide.

Figure 3:
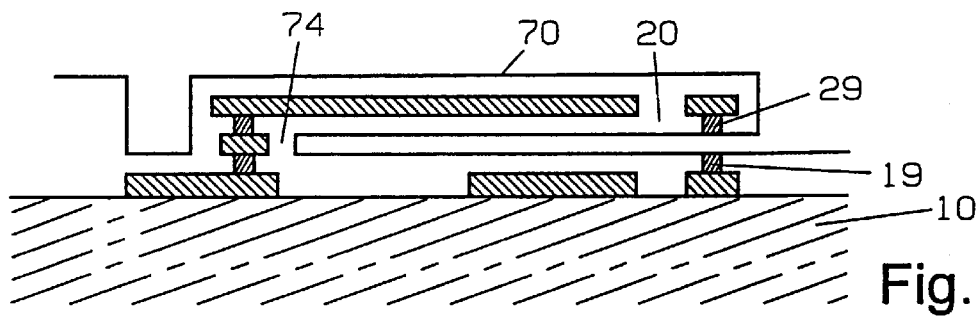
FIG. 3 is the structure of FIG. 2 after a wet metal etch.

FIG. 3 shows the structure of FIG. 2 after a further etch, preferably a wet metal etch to remove the exposed metallization, including Metal 4 and Metal 2. Referring to FIG. 1, the etch should be specific to the metal of metal layers 22–26 and 42–44, and should not substantially etch plugs 19 or 29; for example, an $H_3PO_4$ acid-based etchant may be used. Thus, Metal 2 segment 26 (FIG. 1) functions as a sacrificial layer to separate tungsten plugs 19 and 29, and also to free armature cantilever structure 70, except where it is anchored to substrate 10 by anchor structure 74.

Figure 4:
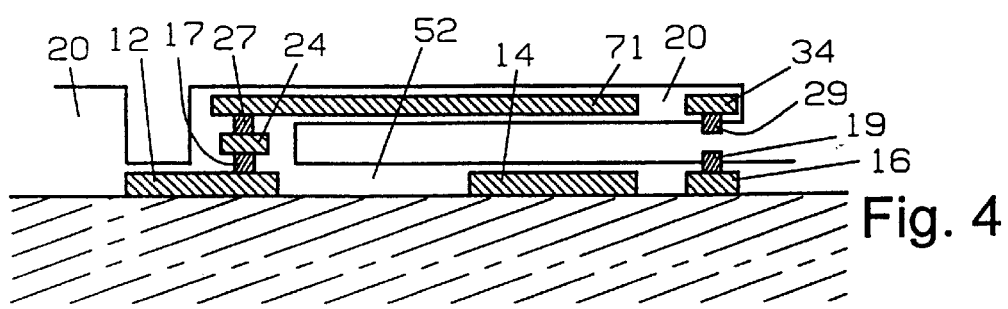
FIG. 4 is the structure of FIG. 3 after a depth controlled dielectric etch of the $SiO_2$.

FIG. 4 shows the structure of FIG. 3 after a controlled-depth etch of dielectric material to trim back dielectric 20. This etch step will affect the dielectric thickness, and hence the stiffness, of cantilever beam 72, and may affect the minimum spacing between upper plate 71 and lower plate 14 if the armature rigidity is low enough that armature 70 actually touches lower switch dielectric 52. An important function of this etch is to expose tungsten plugs 19 and 29, such that upon actuation they contact each other without interference from surrounding dielectric material. Assuming that metallization thickness and dielectric thickness are both approximately 1 micron, as discussed above with regard to FIG. 1, the etching should be timed to remove approximately one half micron of dielectric. The time will of course depend upon the temperature, the concentration and choice of etchant, and can be readily determined by one skilled in the art. It is preferred that at least 0.25 micron of dielectric be removed during this step in order to adequately expose tungsten plugs 19 and 29 to ensure good contact.

FIG. 5 shows the completed MEM switch of FIG. 4 following a further etching step to expose metal for wire bonding. Pad 13 on metallization segment 12 is an exemplary wire bonding pad which is exposed during this etching step. Portions of the device which are not to be etched in this step may be protected by any technique, such as photoresist. Ledge 62 is residual dielectric material which has been protected by photoresist, and thus ledge 62 defines the edge of exposed wire bonding pad 13.

FIG. 6 shows the MEM switch of FIG. 5 after sufficiently different potentials are applied to upper plate 71 via source connection trace 12, tungsten plug 17, metallization segment 24, tungsten plug 27, and upper plate connecting strip 73, and to lower plate 14 via lower connecting trace 13. Upon application of this differential plate potential, upper plate 71 is drawn toward lower plate 14 until tungsten plugs 19 and 29 touch so that the switch can conduct signals through armature connection trace 34.

There is hysteresis in the armature position as a function of the plate potential. The attractive force between the upper and lower plates is a function of the square of the distance between the plates, while the cantilever resisting force is approximately a linear function of the plate distance; thus, once the potential between the plates exceeds a "snap-down" voltage, the armature will suddenly be drawn to a fully closed position as shown. The armature will not be released until the plate potential drops below a "hold-on" voltage, which is typically several volts less than the snap-down voltage, and then will release suddenly. This hysteresis ensures firm actuation.

FIG. 7 shows the completed MEM switch in plan view. Lower plate 14 (FIG. 6) provides the actuation-force region on substrate 10. Armature 70 preferably has a widened portion including upper plate 71 and switch conductor 34. Upper plate 71 is an electrostatic plate providing the armature actuation-force region which, in conjunction with the foundation actuation-force region provided by lower plate 14 (FIG. 6), causes armature 70 to move with respect to substrate 10 when an appropriate potential is applied. (Lower plate 14 is roughly coincident with upper plate 71. Though it may be discerned as a dashed line, it is not designated in FIG. 7). The widened portion of armature 70 is supported from anchor 74 by cantilever beam 72. The dimensions of the switch are very dependent upon desired operation, and upon the thickness of layers provided by the fabricating foundry. For 1 micron metal and dielectric, preferred dimensions are about 80 microns for the width of armature 70, 120 microns for the length, 24 microns for the width and 75 microns for the length of cantilever beam 72. Since cantilever beam 72 is narrower, upon actuation it will bend more than the wider portion of the armature. This view of the present embodiment shows the connection, across switch conductor 34, of signal connection traces 16 and 18 by means of tungsten plugs 28 and 29. The switch conductor width shown is about 30 microns, but depends on circuit requirements such as impedance and capacitive isolation from upper plate 71. All of the foregoing dimensions are subject to wide variation depending upon the particular switch application and foundry preferences.

Feature 62 merely defines the edge of pad 13, which is a portion of source connection trace 12 exposed as a bonding pad, as described above with respect to FIG. 5. Similar pads could of course be exposed as needed on the Metal 1 layer.

Actuation occurs when source connection trace 12, plug 27, and armature trace 73 bring a first electric potential to upper plate 71, while lower plate connection trace 13 connects a different electric potential. Signal line 16 is connected to signal line 18 via contacts 28 and 29 and conductor 34 when armature 70 is actuated.

ALTERNATIVE EMBODIMENTS

It will be understood by those skilled in the art that the foregoing description is merely exemplary, and that a wide range of variations may be employed within the scope of the present invention, which is defined only by the attached claims. For example, an important purpose of the invention is compatibility with existing integrated circuit fabrication processes for low cost. Accordingly, while CMOS is the preferred embodiment, other multiple-metal layer processes may be used.

Tungsten is currently the metal of choice for multiple metallization layer CMOS process interconnect vias, and is known to work well as a contact material. However, the present invention describes using CMOS process via material for contacts in MEM switches. Other materials might be used for such vias; for example, copper, nickel, titanium or alloys of metals might be utilized for some multiple metallization layer CMOS process interconnect vias, either now or in the future. The present invention encompasses the use of such alternative via materials, which will be formed into contacts by steps entirely analogous to those described above for tungsten vias.

The actuation (closing) voltage and dropout (opening) voltage of the MEM switch will depend upon the armature layer construction, the electrostatic plate sizes, the cantilever material, thickness, length and width, and the spacing between armature and substrate, to mention only a few variables, and thus the actuation voltage will vary widely between embodiments.

The currently preferred embodiment utilizes a single tungsten plug at each circuit connection point. However, it is believed desirable, for some applications, to use a plurality of tungsten plug contacts at circuit contact points. Moreover, the connection arrangement shown for the described embodiment could be varied substantially.

Variations in the substrate are to be expected in some applications. For example, the material upon which the metal layers are disposed will often have been patterned and processed to form semiconductor devices therein. It is only important that there be adequate flat surface available in the vicinity of the switch which is amenable to deposition of the described metallization and dielectric layers.

Dielectric material may also be varied, as long as corresponding selective dielectric and metal etching processes are available to process as described above for $SiO_2$.

A preferred embodiment and some variations of the invention have been described above, and other embodiments will be immediately apparent to one skilled in the art. Though such further embodiments are not expressly discussed herein, it is understood that the invention is not to be restricted to the embodiments expressly discussed herein, but is defined only by the claims which follow.

What is claimed is:

1. A microelectromechanical switch comprising:
    a moveable armature having a first position and a second position;
    a foundation relative to which said armature moves;
    actuation-force regions for applying a force between said armature and said foundation to move the armature from the first position to the second position; and
    at least one mating contact pair, each mating contact pair including at least one contact point on said armature and at least a second contact point on said foundation, the mating contacts contacting each other when the armature is in the second position and being separated from each other when the armature is in the first position;
        wherein at least one of said contact points includes tungsten and each contact point of said mating contact pair protrudes through partially surrounding dielectric material towards a mating contact point.

2. A switch according to claim 1 wherein the first and second contact points both include tungsten.

3. A switch according to claim 1 comprising a plurality of mating contact pairs, wherein each contact point of each mating pair includes tungsten.

4. A switch according to claim 1 wherein said actuation-force regions include an armature plate disposed on said armature and a foundation plate disposed on said foundation opposite said armature plate.

5. A microelectromechanical switch structure comprising:
    a moveable armature having a first position and a second position, said armature having a metal upper plate;
    a foundation relative to which said armature moves, said foundation having a metal lower plate disposed beneath said metal upper plate, said lower plate being covered by at least one layer of dielectric material;
    a switch contact electrically connected to said upper plate, wherein a voltage applied between said switch contact and said lower plate moves the armature from the first position to the second position; and
    at least one mating contact pair, each mating contact pair including at least one contact point on said armature and at least a second contact point on said foundation, the mating contacts contacting each other when the armature is in the second position and being separated from each other when the armature is in the first position,
        wherein said structure is made by CMOS fabrication steps.

6. The microelectromechanical switch structure of claim 5, wherein the electrical connection between the switch contact and the upper layer being at least one tungsten plug.

7. The microelectromechanical switch structure of claim 5, wherein said moveable armature comprises:
    an anchor portion disposed on said foundation;
    a cantilever portion having a proximal end and a distal end, said proximal end disposed at said anchor portion
    an armature portion disposed at said distal end, said armature portion having said armature plate.

8. The microelectromechanical switch structure of claim 7, wherein the electrical connection between the switch contact and the armature comprises a vertical via disposed within said anchor portion and a conducting strip disposed on or within said cantilever portion.

9. The microelectromechanical switch structure of claim 8, wherein the vertical via comprises:
    a first tungsten plug electrically connected to said switch contact;
    a metal layer electrically connected to said first tungsten plug; and
    a second tungsten plug electrically connected to said metal layer and electrically connected to said conducting strip.

10. The microelectromechanical switch structure of claim 7, wherein said cantilever portion has a length of about 75 microns and a width of about 24 microns and said armature portion has a length of about 120 microns and a width of about 80 microns.

11. The microelectromechanical switch structure of claim 5, wherein the first and second contact points both include tungsten.

12. The microelectromechanical switch structure of claim 5, comprising a plurality of mating contact pairs, wherein each contact point of each mating pair includes tungsten.

13. The microelectromechanical switch structure of claim 5, wherein at least one contact point protrudes toward a mating contact point from insulating material at least partially surrounding the contact point.

14. The microelectromechanical switch structure of claim 5, wherein each contact point of each mating contact pair protrudes through partially surrounding dielectric material towards a mating contact point.

15. The microelectromechanical switch structure of claim 5, wherein the CMOS fabrication steps comprise:
    forming metal in at least three substantially plane-parallel layers, each metal layer separated from at least one adjacent metal layer by a dielectric material layer;
    forming vias through the dielectric material separating at least some of said adjacent metal layers to form connecting plugs therebetween, each via having an axis, each axis being substantially perpendicular to a plane of a metal layer so connected;

disposing at least a first and a second of said vias as contact vias by forming said contact vias through different dielectric material layers along approximately coincident axes; and, removing material separating said contact vias such that the contact vias form said at least one mating contact pair.

16. The microelectromechanical switch structure of claim 14, wherein the step of etching away material between said first and second vias includes etching away an intervening metal layer, and wherein the contact vias include tungsten.

17. A microelectromechanical switch structure comprising:

a foundation relative to which said armature moves, said foundation having a metal lower plate;

a moveable armature moving relative to said foundation and having a first position and a second position, said armature comprising:
an anchor portion disposed on said foundation;
a cantilever portion having a proximal end and a distal end, said proximal end disposed at said anchor portion; and
an armature portion disposed at said distal end, said armature portion having a metal upper plate disposed above said lower plate;

a switch contact electrically connected to said upper plate, wherein a voltage applied between said switch contact and said lower plate moves the armature from the first position to the second position; and at least one mating contact pair, each mating contact pair including at least one contact point on said armature and at least a second contact point on said foundation, the mating contacts contacting each other when the armature is in the second position and being separated from each other when the armature is in the first position,
wherein the electrical connection between the switch contact and the upper plate comprises a vertical via disposed within said anchor portion and a conducting strip disposed on or within said cantilever portion and connecting said vertical via to said upper plate.

18. The microelectromechanical switch structure of claim 17, wherein the vertical via comprises:

a first tungsten plug electrically connected to said switch contact;

a metal layer electrically connected to said first tungsten plug; and a second tungsten plug electrically connected to said metal layer and electrically connected to said conducting strip.

19. The microelectromechanical switch structure of claim 17, wherein said cantilever portion has a length of about 75 microns and a width of about 24 microns and said armature portion has a length of about 120 microns and a width of about 80 microns.

* * * * *